(12) United States Patent
Chen et al.

(10) Patent No.: US 11,664,186 B1
(45) Date of Patent: May 30, 2023

(54) APPARATUS OF ELECTRON BEAM COMPRISING PINNACLE LIMITING PLATE AND METHOD OF REDUCING ELECTRON-ELECTRON INTERACTION

(71) Applicant: BORRIES PTE. LTD., Singapore (SG)

(72) Inventors: Zhongwei Chen, Los Altos Hills, CA (US); Wei Fang, Saratoga, CA (US); Xiaoming Chen, Sunnyvale, CA (US); Daniel Tang, Fremont, CA (US); Liang-Fu Fan, Fremont, CA (US)

(73) Assignee: BORRIES PTE. LTD., Singapore (SG)

( * ) Notice: Subject to any disclaimer, the term of this patent is extended or adjusted under 35 U.S.C. 154(b) by 0 days.

(21) Appl. No.: 17/817,989

(22) Filed: Aug. 7, 2022

(51) Int. Cl.
  *H01J 37/09* (2006.01)
  *H01J 37/073* (2006.01)
  *H01J 37/317* (2006.01)
  *H01J 37/28* (2006.01)
  *H01J 37/244* (2006.01)

(52) U.S. Cl.
  CPC ............ *H01J 37/09* (2013.01); *H01J 37/073* (2013.01); *H01J 37/28* (2013.01); *H01J 37/3174* (2013.01); *H01J 37/244* (2013.01); *H01J 2237/0455* (2013.01); *H01J 2237/0473* (2013.01)

(58) Field of Classification Search
  CPC .. H01J 37/00; H01J 37/02; H01J 37/09; H01J 37/073; H01J 37/26; H01J 37/28; H01J 37/3174; H01J 37/244; H01J 2237/0455; H01J 2237/0473
  USPC ......................................... 250/306, 307, 311
  See application file for complete search history.

(56) References Cited

U.S. PATENT DOCUMENTS 10,096,447 B1 * 10/2018 Jiang ..................... H01J 37/063

* cited by examiner

*Primary Examiner* — Jason L McCormack
(74) *Attorney, Agent, or Firm* — George Guosheng Wang; Upstream Research and Patent LLC

(57) ABSTRACT

The present invention provides an apparatus of electron beam comprising an electron gun with a pinnacle limiting plate having at least one current-limiting aperture. The pinnacle limiting plate is located between a bottom (or lowest) anode and a top (or highest) condenser within the electron gun. A current (ampere) of the electron beam that has passed through the current-limiting aperture remains the same (unchanged) after the electron beam travels through the top condenser and an electron optical column and arrives at a sample space. Electron-electron interaction of the electron beam is thus reduced.

20 Claims, 16 Drawing Sheets

Figure 15

APPARATUS OF ELECTRON BEAM COMPRISING PINNACLE LIMITING PLATE AND METHOD OF REDUCING ELECTRON-ELECTRON INTERACTION

FIELD OF THE INVENTION

The present invention generally relates an apparatus of electron beam with lowered electron-electron interaction comprising a pinnacle limiting plate and a method of reducing electron-electron interaction. Although the invention will be illustrated, explained, and exemplified by electron microscopes, it should be appreciated that the present invention can also be applied to other fields, for example, electron beam recorder, electron beam lithography system, and the like.

BACKGROUND OF THE INVENTION

Apparatuses of charged-particle beam such as transmission electron microscope (TEM) and scanning transmission electron microscope (STEM) are widely used in fields of medical diagnosis, biological research, material analysis, and semiconductor inspection etc. With their high-resolution image technique, TEM and STEM are used as a particularly important diagnostic tool to screen virus, human tissues at high magnification (the ultrastructural level) or material analysis, often in conjunction with other methods, particularly light microscopy, immunofluorescence techniques and PCR etc.

For example, TEM/STEM has great potential for diagnostic purposes when it (1) provides useful (complementary) information in the context of a carefully considered differential diagnosis; (2) provides an 'improved' diagnosis that results in better treatment strategies; and (3) is time & cost effective in respect to alternative techniques. For diagnostic purposes, solid tissues or virus sample can be prepared for TEM/STEM in the same way as other biological tissues. The samples are fixed in glutaraldehyde and osmium tetroxide then dehydrated and embedded in epoxy resin. The ultrathin sections may be collected on 3 mm copper (mesh) grids and stained with uranyl acetate and lead citrate to make the contents of the tissue or virus electron dense (and thus visible in the electron microscope).

Imaging of an electron beam system are usually carried out using a tightly focused beam (electron probe), the spatial resolution of the system refers to the smallest beam diameter from which spatial information can be obtained. The probe size in general is determined by the electron source size, lens aberrations and electron diffraction at the condenser aperture; however, it can in principle be broadened by Coulomb interactions between the electrons within the electron beam illumination system.

The image resolution of an electron beam system is subject to degradation by lens aberrations. Usually chromatic aberration is the most important factor, since the energy and angular widths of the focused electrons are considerable. Adopting a monochromator or an energy filtered unit to the electron beam system can decrease energy spread of the electron beam and thereafter reduce the chromatic aberration of the system.

However, how to decrease Coulomb interactions between electrons is still an important issue in electron beam system. A conventional solution is to increase primary beam energy, but landing energy is also increased. If a higher landing energy is not preferred to the practice, a larger retarding force must be applied to the focused primary beam between the objective lens and the specimen, which will incur much more complicated mechanism to the electron beam system. Advantageously, the present invention provides a solution to solve the problem in the prior art.

SUMMARY OF THE INVENTION

One aspect of the present invention provides an apparatus of electron beam comprising an electron gun, an electron optical column below the electron gun, and a sample chamber below the column. The electron gun comprises a bottom (or lowest) anode, a top (or highest) condenser, and a pinnacle limiting plate therebetween. The pinnacle limiting plate has at least one current-limiting aperture. The sample chamber has a sample space for placing a specimen under examination or a lithographical workpiece (e.g. mask or wafer). Such an apparatus may be so configured that a current (ampere) of the electron beam that has passed through the at least one current-limiting aperture remains the same after the electron beam travels through the top condenser and the electron optical column and arrives at the sample space.

Another aspect of the present invention provides a method of reducing electron-electron interaction of an electron beam in an apparatus of electron beam. The method includes (i) providing an apparatus of electron beam comprising an electron gun, an electron optical column below the electron gun, and a sample chamber below the column, wherein the electron gun comprises a bottom (or lowest) anode and a top (or highest) condenser, and wherein the sample chamber has a sample space for placing a specimen under examination or a lithographical workpiece (e.g. mask or wafer); (ii) placing a pinnacle limiting plate between the bottom anode and the top condenser, wherein the pinnacle limiting plate has at least one current-limiting aperture; and (iii) passing an electron beam through the at least one current-limiting aperture, wherein a current (ampere) of the electron beam that has passed through the at least one current-limiting aperture remains the same after the electron beam travels through the top condenser and the electron optical column and arrives at the sample space.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form, omitted, or merely suggested, in order to avoid unnecessarily obscuring the present invention.

FIG. 15 shows the image of a biological sample in a large FOV with low resolution and a small FOV with high resolution in accordance with an exemplary embodiment of the present invention.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

Where a numerical range is disclosed herein, unless otherwise specified, such range is continuous, inclusive of both the minimum and maximum values of the range as well as every value between such minimum and maximum values. Still further, where a range refers to integers, only the integers from the minimum value to and including the maximum value of such range are included. In addition, where multiple ranges are provided to describe a feature or characteristic, such ranges can be combined.

It is also to be understood that the terminology used herein is for the purpose of describing particular embodiments only, and it is not intended to limit the scope of the invention. For example, when an element is referred to as being "on", "connected to", or "coupled to" another element, it can be directly on, connected or coupled to the other element or intervening elements may be present. In contrast, when an element is referred to as being "directly on", "directly connected to", or "directly coupled to" another element, there are no intervening elements present.

Figure 1:
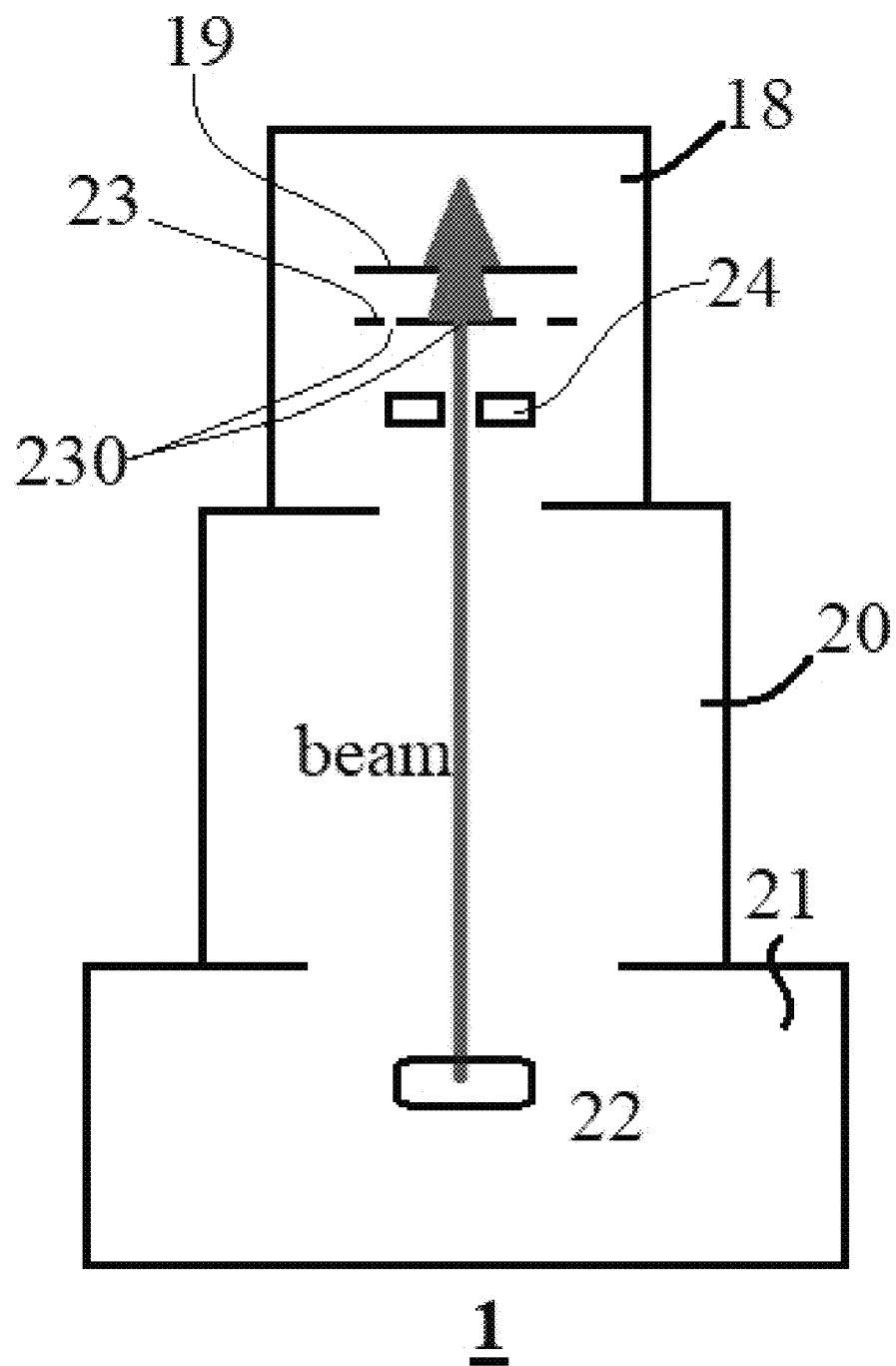
FIG. 1 is a schematic diagrammatic representation of an apparatus of electron beam comprising an electron gun with a pinnacle limiting plate having one current-limiting aperture in accordance with an exemplary embodiment of the present invention.

With reference to FIG. 1, various embodiments of the invention provide an apparatus 1 of electron beam which includes an electron gun 18, an electron optical column 20 below the electron gun 18, and a sample chamber 21 below the column 20. The electron gun 18 typically includes a bottom (or lowest) anode 19, a top (or highest) condenser 24, and a pinnacle limiting plate 23 therebetween. When there is only one anode in the electron gun 18, that anode is the so-called bottom (or lowest) anode 19. When there is only one condenser in the electron gun 18, that condenser is the so-called top (or highest) condenser 24. In some embodiments, the pinnacle limiting plate 23 is immediately below the bottom anode 19 (i.e. with only a vacuum gap between the two). In some embodiments, the pinnacle limiting plate 23 is immediately above the top condenser 24 (i.e. with only a vacuum gap between the two). In some other embodiments, the pinnacle limiting plate 23 is immediately below the bottom anode 19 (i.e. with only a vacuum gap between the two); and the pinnacle limiting plate 23 is also immediately above the top condenser 24 (i.e. with only a vacuum gap between the two).

A condenser lens is used for receiving a primary beam and condensing the primary beam. The electron optical column 20 may include an objective lens for receiving the condensed primary beam and focusing the primary beam to a surface of a specimen or a lithographical workpiece (e.g. mask or wafer).

The pinnacle limiting plate 23 has at least one current-limiting aperture or opening (230), and it may be made of a non-magnetic conductive material. The sample chamber 21 has a sample space 22 for placing a specimen under examination or a lithographical workpiece (e.g. mask or wafer). The apparatus 1 is so configured that a current (ampere) of the electron beam that has passed through (or exits from) the at least one current-limiting aperture 230 remains the same (or remains unchanged) after the electron beam travels through the top condenser 24 and the electron optical column 20 and arrives at the sample space 22.

The pinnacle limiting plate 23 may have two or more current-limiting apertures (230) with different sizes or variant dimensions for allowing electron beams with different currents (ampere) or different cross-sectional areas to pass through. The pinnacle limiting plate 23 may be movable relative to the bottom anode 19 so as to select which one of said two or more current-limiting apertures (230) is used for the electron beam to pass through (i.e. limiting the beam). Different suitable beam currents may be applied for different purposes of the electron beam system. If the electron beam system requires a large beam current to inspect a specimen, a larger current-limiting aperture (230) should be provided.

On the other hand, if the electron beam system requires a small beam current to inspect a specimen, a smaller current-limiting aperture (230) should be used to decrease electron-electron interaction of the electron beam; otherwise, a larger electron-electron interaction would incur more dispersion issue.

Figure 2:
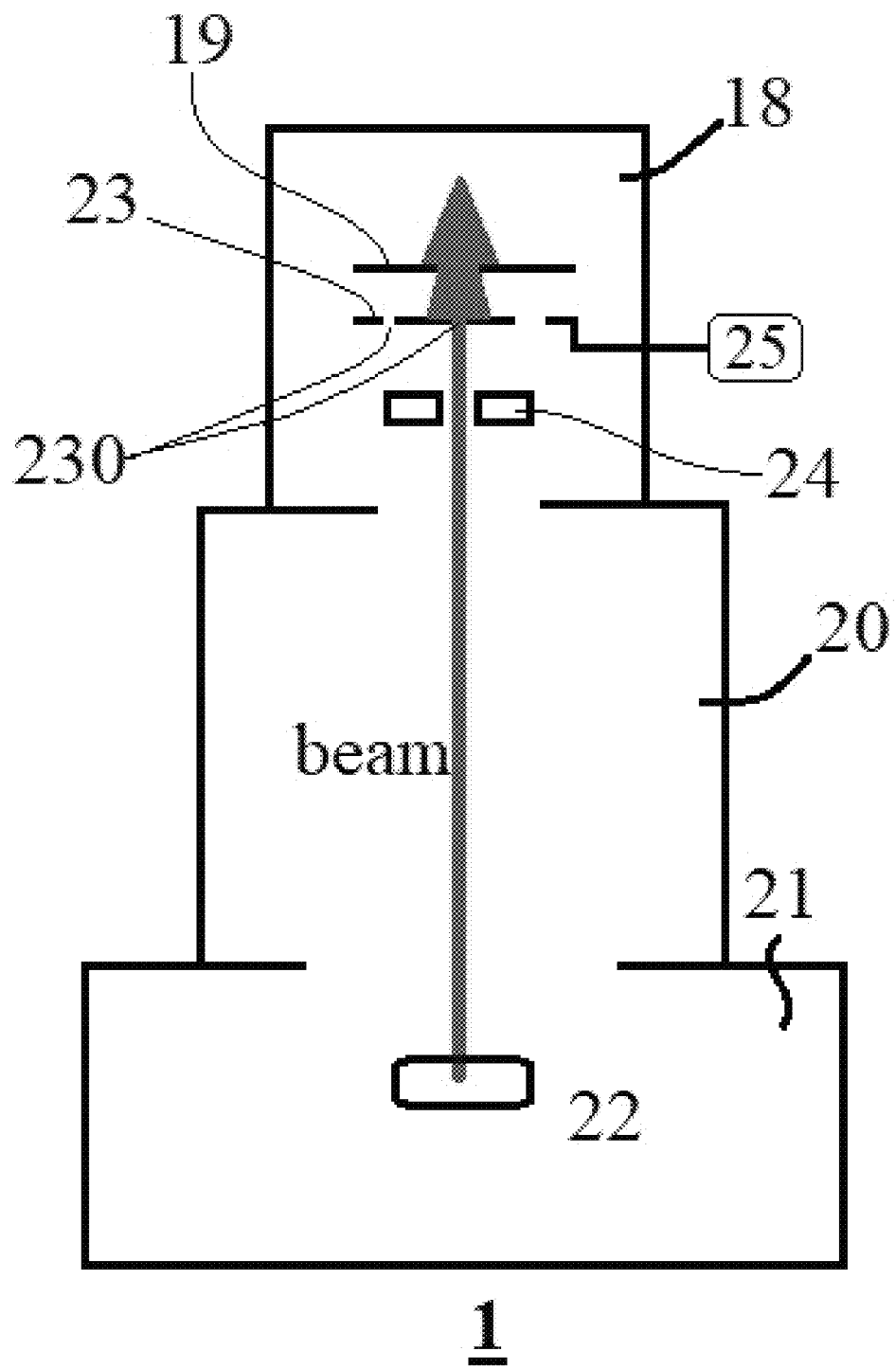
FIG. 2 schematically illustrates an apparatus of electron beam comprising an electron gun with a pinnacle limiting plate having two or more current-limiting apertures in accordance with an exemplary embodiment of the present invention.

As shown in FIG. 2, the apparatus 1 of electron beam may include a motor 25 for moving the pinnacle limiting plate 23 relatively to the bottom anode 19. Typically, the motor 25 can move (position and reposition) the pinnacle limiting plate 23 with an accuracy of 100 nm. Examples of motor 25 include, but are not limited to, a voice coil motor, a piezoelectric motor, and the like. Voice coil motors (VCM) or voice coil actuators (VCA) are non-commutated DC linear actuators that consist of a single-pole permanent magnet and a copper coil. VCMs are two-lead, single phase motors that do not require commutation, resulting in simple operation. Voice coil actuators are typically used in focusing applications, oscillatory systems, mirror tilting, and miniature position control. For example, autofocus is one of the key features required for many embedded vision applications. An autofocus camera module with a VCM is typically used when the distance to the target object keeps varying during image capture. A piezoelectric motor or piezo motor is a type of electric motor based on the change in shape of a piezoelectric material when an electric field is applied, as a consequence of the converse piezoelectric effect. An electrical circuit makes acoustic or ultrasonic vibrations in the piezoelectric material, most often lead zirconate titanate and occasionally lithium niobate or other single-crystal materials, which can produce linear or rotary motion depending on their mechanism. Examples of piezoelectric motors include inchworm motors, stepper and slip-stick motors as well as ultrasonic motors which can further be further categorized into standing wave and travelling wave motors.

It should be appreciated that any suitable electron gun can be used in the present invention. One type of electron source is a thermionic source in which material is heated to a temperature at which electrons are emitted. Another type of electron source applies a very high electric field to a sharp tip of an emitter in order to extract electrons. Examples include a field emission-type electron source, a Schottky-type electron source, and the like. These are characterized in that the tip of an emitter used in an electron gun is sharpened to generate an electric field concentrating effect at the tip and to emit or emanate more electrons through the tip. Known designs for electron guns are the Rogowski electron gun or the Pierce electron gun, among others.

In some embodiments, the electron gun includes an electron source, a focusing electrode, and an accelerating electrode. The electron source is typically a cathode heated by an electric current to cause the cathode to emit electrons. The focusing electrode is typically negatively charged to repel the electrons and thereby direct the electrons in a direction generally toward the accelerating electrode. The accelerating electrode is positioned downstream from the electron source and the focusing electrode, it can function as the bottom anode 19 in the present invention. The accelerating electrode is typically less negatively charged than the electron source and the focusing electrode to cause the electrons to form into a beam and travel in the downstream direction.

For example, a cathode may serve as a source of electrons for the electron beam. The electrons released from the cathode are then subjected to a first focusing by a Wehnelt cylinder, in which the electrons are aligned with an anode formed mostly as a pinhole aperture. The focusing of electrons to a continuous electron beam takes place by the Wehnelt cylinder. Focusing takes place by generating a potential difference between the Wehnelt cylinder, which is usually concavely shaped, and the anode, so that the electrons are refracted toward a common focus along this potential, which is usually idealized as a half-shell shape. Between the anode (which has a positive electrical potential relative to the cathode) and the cathode, the electrons are accelerated.

Figure 3A:
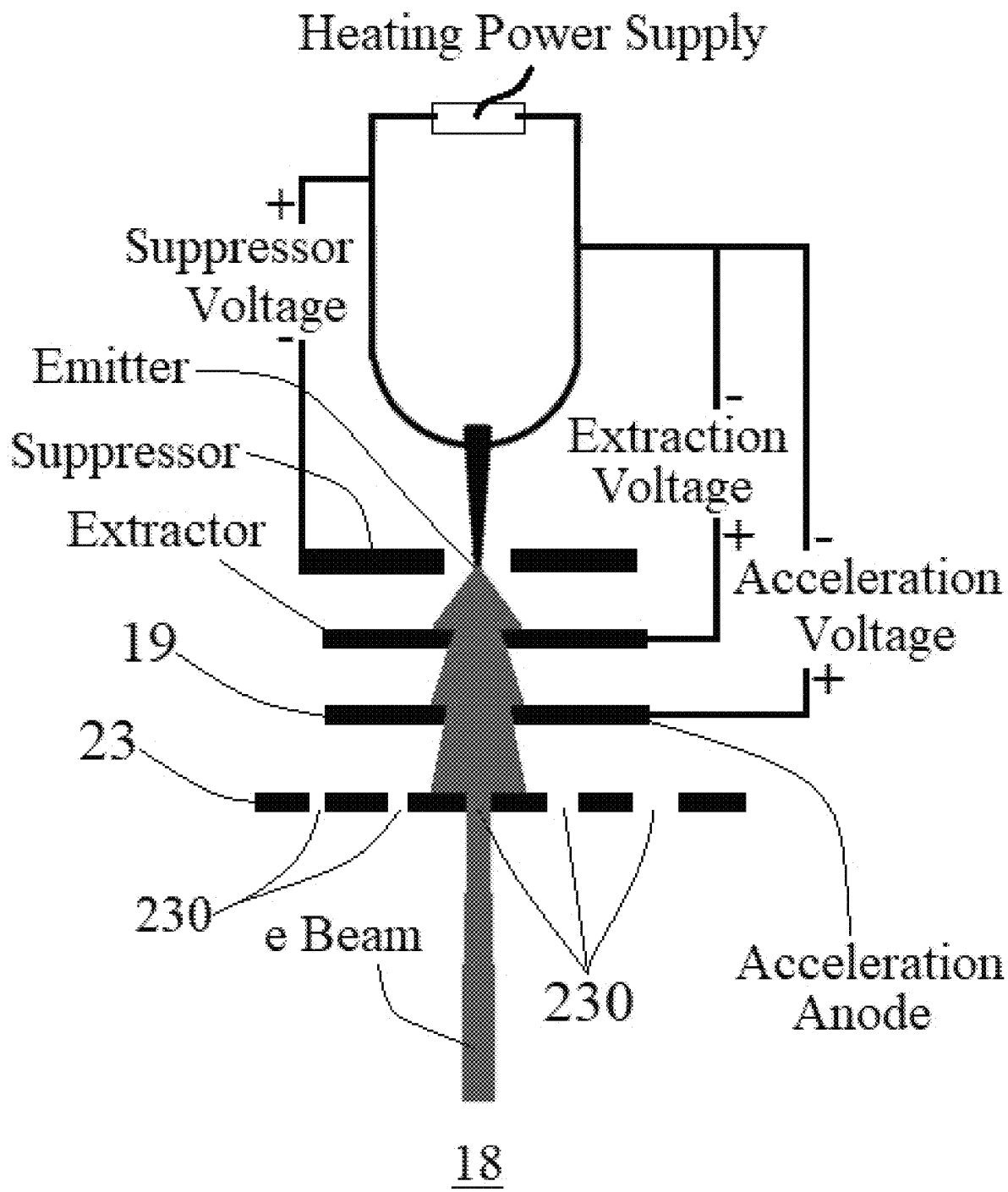
FIG. 3A schematically illustrates an electron gun with a pinnacle limiting plate having two or more current-limiting apertures in accordance with an exemplary embodiment of the present invention.
Figure 3B:
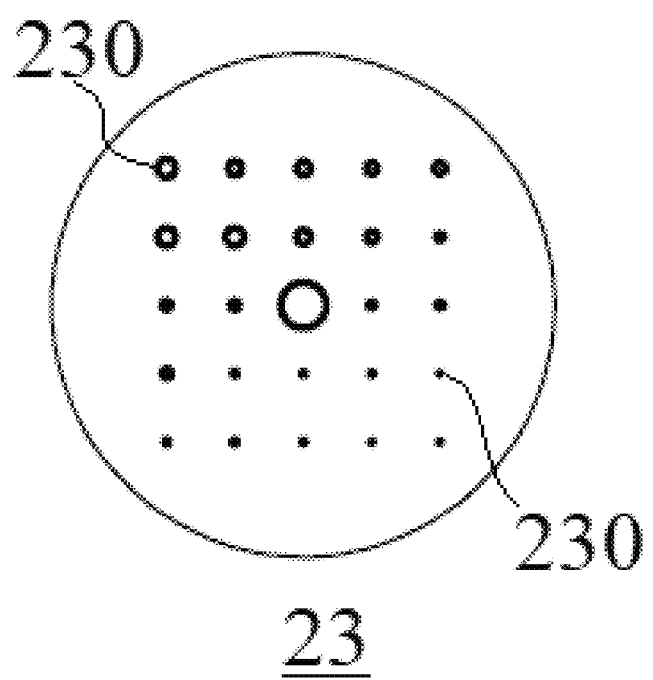
FIG. 3B shows a pinnacle limiting plate having two or more current-limiting apertures in accordance with an exemplary embodiment of the present invention.

In some embodiments as shown in FIG. 3A, the bottom anode 19 within the electron gun 18 may be an acceleration anode. For example, the electron gun 18 may be a field emission-type electron gun, which includes a cathode (e.g. in a form of sharp tip emitter) as an electron source, an extractor (e.g. an extraction anode) with a hole below the cathode. The acceleration anode 19 with a hole (for electron beam to pass through) is located below the extractor. FIG. 3B shows a pinnacle limiting plate 23 having two or more current-limiting apertures such as 20-30 e.g. 25 current-limiting apertures in accordance with a specific embodiment of the present invention. The pinnacle limiting plate 23 may be made of platinum, gold, molybdenum, copper, tantalum, platinum-iridium (e.g. with a composition ratio of 95:5), graphite, or any other suitable materials.

In typical embodiments, the current (ampere) of the electron beam that has passed through the current-limiting aperture 230 is in a range of from 1 picoamp to 500 nanoamps.

The sample chamber 21 may include a specimen holder 9 for holding said specimen under examination, a receptacle for receiving said lithographical workpiece (e.g. mask or wafer) being processed with the electron beam, which will be described in more details. In some preferred embodiments, the top condenser 24 may include a first co-condenser 3 and a second co-condenser 4, which will also be described in more details.

The electron optical column 20 may include one or more electron optical components selected from stigmator(s), alignment coil(s), alignment plate(s), deflector(s), beam blanking(s), plate(s) with spread aperture(s), magnetic objective lens(es), and detector(s). However, the electron optical column 20 and the sample chamber 21 do not include any plate with limiting aperture(s). In other words, the electron optical column 20 and the sample chamber 21 do not include any plate with a limiting aperture that is sufficiently small to limit or lower the current (ampere) of the electron beam that has just passed through the at least one current-limiting aperture 230. This will guarantee that the current (ampere) will keep the same when the electron beam travels through the top condenser 24 and the electron optical column 20. This will also guarantee that the current (ampere) will keep the same when the electron beam arrives at the sample space 22.

In various embodiments, the electron optical column 20 may include one or more electron optical components selected from (from beam upstream to downstream) a stigmator (71s), an upper macroscopic deflector 71a, an upper microscopic deflector 72a, a lower microscopic deflector 72b, a lower macroscopic deflector 71b, a magnetic objective lens 6, and a BSE or SE detector 15, as will be described in more details. The sample chamber 21 may further include one or more detectors for detecting electrons.

In preferred embodiments, the apparatus 1 is configured as an electron microscope (such as SEM and STEM) and an electron beam lithographical apparatus.

Figure 4:
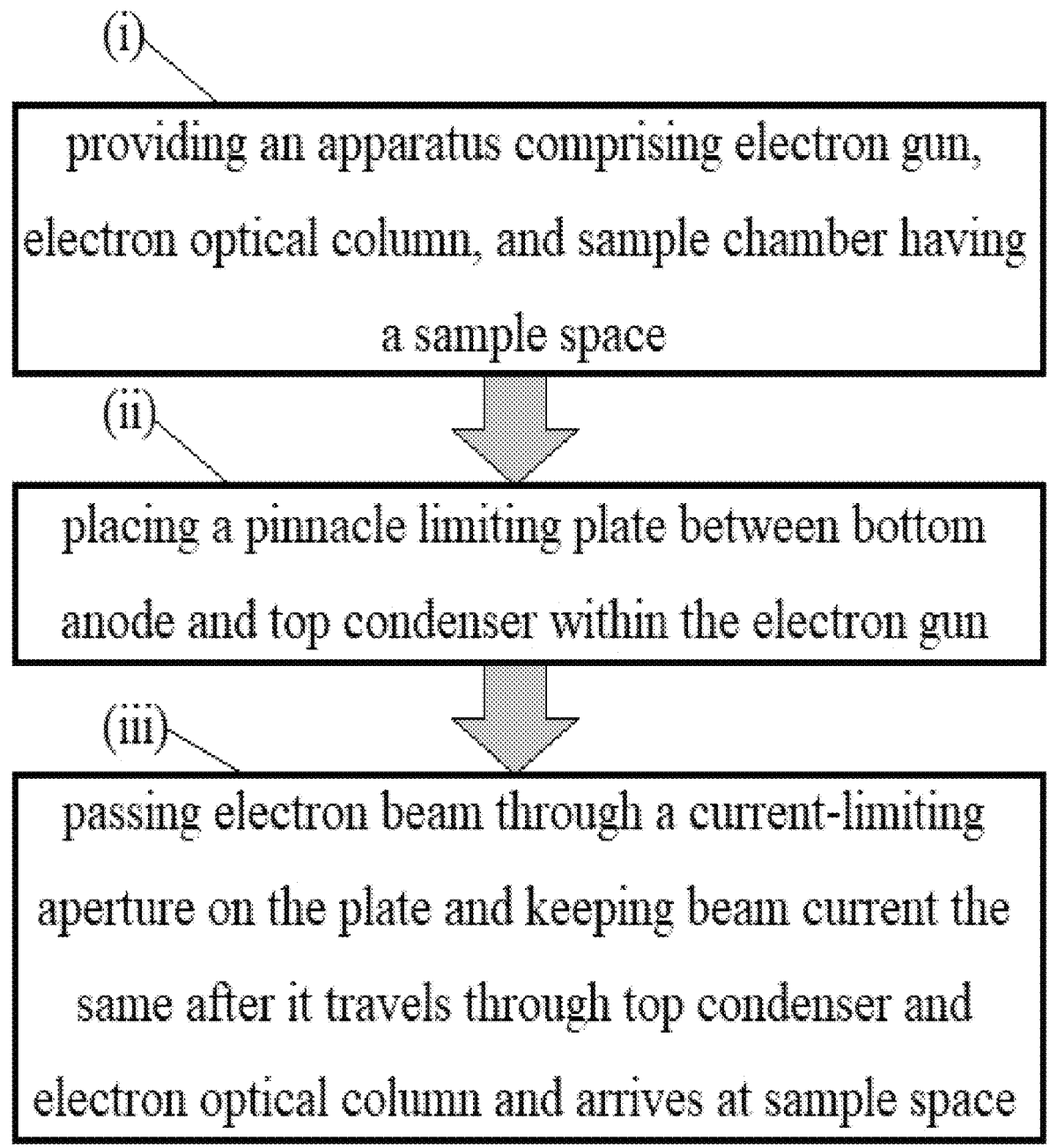
FIG. 4 is a flow chart showing a method of reducing electron-electron interaction of an electron beam in an apparatus of electron beam in accordance with an exemplary embodiment of the present invention.

Referring to FIG. 4, the present invention provides a method of reducing electron-electron interaction of an electron beam in an apparatus of electron beam, comprising the following steps: (i) providing an apparatus of electron beam comprising an electron gun 18, an electron optical column 20 below the electron gun 18, and a sample chamber 21 below the column 20, wherein the electron gun 18 comprises a bottom (or lowest) anode 19 and a top (or highest) condenser 24, and wherein the sample chamber 21 has a sample space 22 for placing a specimen under examination or a lithographical workpiece (e.g. mask or wafer); (ii) placing a pinnacle limiting plate 23 between the bottom anode 19 and the top condenser 24, wherein the pinnacle limiting plate 23 has at least one current-limiting aperture (230); and (iii) passing an electron beam through the at least one current-limiting aperture 230, wherein a current (ampere) of the electron beam that has passed through the at least one current-limiting aperture 230 remains the same after the electron beam travels through the top condenser 24 and the electron optical column 20 and arrives at the sample space 22.

In the method, the pinnacle limiting plate 23 has two or more current-limiting apertures (230) with different sizes for allowing electron beams with different currents (ampere) or different cross-sectional areas to pass through. As such, the method my further include a step of moving the pinnacle limiting plate 23 relatively to the bottom anode 19 so as to select which one of said two or more current-limiting apertures (230) is used for the electron beam to pass through (i.e. limiting the beam). Moving the pinnacle limiting plate 23 may be accomplished with a motor 25 such as a voice coil motor or a piezoelectric motor, as long as the motor 25 can move (position and reposition) the pinnacle limiting plate 23 with an accuracy of 100 nm. Pinnacle limiting plate 23 can be used for trimming different amounts of unnecessary electrons from an electron source.

As described above, the top condenser 24 in some embodiments may include a first co-condenser 3 and a second co-condenser 4. First, the concept of "co-condensers" as used in an apparatus of charged-particle beam (including electron beam) will be explained with reference to FIGS. 5-6. In an apparatus of charged-particle beam such as an electron microscope (e.g. SEM and STEM), the manipulation of an electron beam is performed using two physical effects. The interaction of electrons with a magnetic field will cause electrons to move according to the left-hand rule, thus allowing for electromagnets to manipulate the electron beam. The use of magnetic fields allows for the formation of a magnetic lens of variable focusing power, and the lens shape is determined by the distribution of magnetic flux. Electrostatic fields can cause the electrons to be deflected through a constant angle. Coupling of two deflections in opposing directions with a small intermediate gap allows for the formation of a shift in the beam path. From these two effects, as well as the use of an electron imaging system, sufficient control over the beam path is made possible. The lenses in the beam path can be enabled, tuned, and disabled entirely and simply via rapid electrical switching, the speed of which is only limited by effects such as the magnetic hysteresis.

Figure 5:
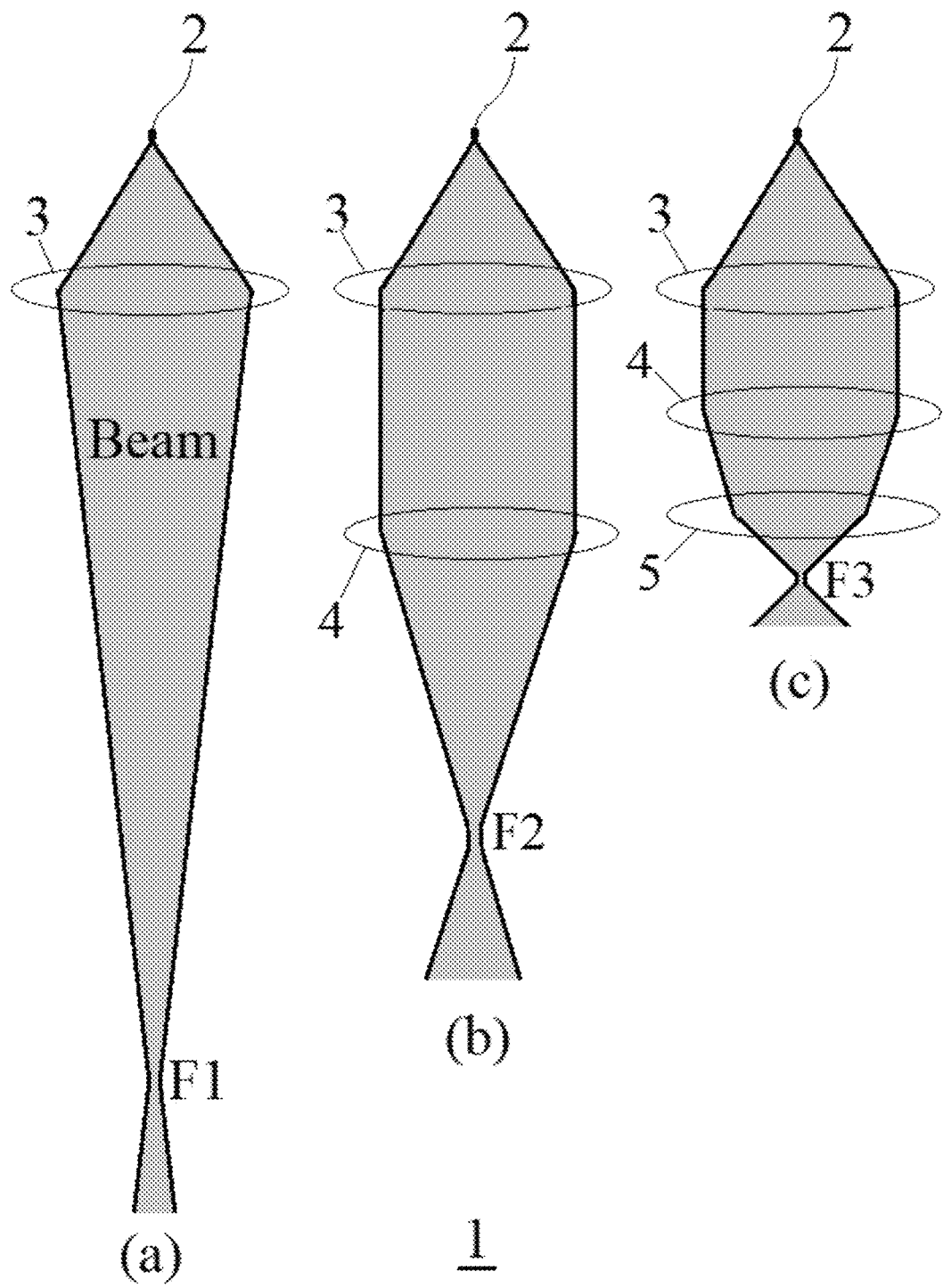
FIG. 5 schematically illustrates the formation of co-condensers which can be used in an apparatus of charged-particle beam in accordance with an exemplary embodiment of the present invention.

In an apparatus 1 of charged-particle beam as shown in FIG. 5, a source 2 of charged particles (such as the sharp tip emitter as shown in FIG. 3A) is configured to emit a beam of charged particles. For simplicity and focusing on the concept of "co-condensers," the extractor (e.g. an extraction anode) and the bottom anode 19 (or the acceleration anode) are omitted in FIGS. 5-6. The source 2 may be for example an electron source with a tungsten filament or a lanthanum hexaboride ($LaB_6$). In panel (a), a magnetic condenser 3 alone can focus the beam to a crossover spot F1. The beam is expanded after a crossover spot. In panel (b), another magnetic condenser 4 is placed between magnetic condenser 3 and crossover spot F1, and the beam is now focused to a new crossover spot F2 that is closer to source 2 than spot F1. In panel (c), a third magnetic condenser 5 is placed between magnetic condenser 4 and crossover spot F2, and the beam is again focused to another new crossover spot F3 that is even closer to source 2 than spot F2.

Generally, a condenser lens (including top condenser 24) forms an image of the primary electron beam source for an objective lens, and the objective lens focuses the condenser lens image onto a specimen. Transmitted, secondary and backscattered electrons are released from the specimen material. These electrons are detected, amplified and the resulting signal used to modulate the beam of an imaging system operating synchronously with the scanning electron beam. The result is an image of the scanned area based on the electrons emitted or scattered from the specimen.

The term "co-condensers" is defined as two or more magnetic condensers configured to coherently focus the beam to a single crossover spot F. For example, magnetic condensers 3 and 4 in panel (b) coherently focus the beam to a single crossover spot F2, and they may be called a set of co-condensers. Magnetic condensers 3, 4 and 5 in panel (c) coherently focus the beam to a single crossover spot F3, and they may also be called a set of co-condensers. As shown in FIG. 5, the beam does not have any crossover spot between any two of the two or more magnetic condensers within a set of co-condensers. The top condenser 24 is the condenser 3, which is the highest among condensers 3-4 in panel (b) or 2-5 in panel (c).

The crossover spot F may be movable or immovable. In some embodiments of the invention, the single crossover spot F is so controlled that it remains stationary or immovable relative to the source 2 of charged particles. For example, crossover spot F2 may be kept stationary relative to the source 2, i.e. the distance D0 between spot F2 and source 2 remains unchanged. By the same token, crossover spot F3 may be kept stationary relative to the source 2, i.e. the distance D0 between spot F3 and source 2 remains unchanged.

While the single crossover spot F remains immovable relative to the source 2 of charged particles, the size A of the beam at crossover spot F (i.e. the cross-sectional area of the beam at F) may be so controlled to have a desired value. Preferably, size A may be tuned/adjusted by concertedly tuning/adjusting the individual condensing capacity of the two or more magnetic condensers within a set of co-condensers. For example, the condensing capacity of condenser 3 and that of condenser 4 may be individually but concertedly tuned/adjusted so that not only the single crossover spot F2 is fixed relative to the source 2, but also the size A of the beam at crossover spot F2 is controlled to have a value as desired. Likewise, the condensing capacities of two or more condensers 3, 4 and 5 may be individually but concertedly tuned/adjusted so that not only the single crossover spot F3 is fixed relative to the source 2, but also the size A of the beam at crossover spot F3 is controlled to have a value as desired. The two or more co-condensers are therefore configured to coherently focus the beam to the same cross-over point with different magnification rates.

Although the apparatus 1 may include one, two or more sets of co-condensers, in some preferred embodiments of the invention, the apparatus 1 includes only one set of co-condensers with only two magnetic condensers configured to coherently focus the beam to a single crossover spot F. For example, the apparatus 1 may include only one set of co-condensers as shown in Panel (b) of FIG. 5 with only two magnetic condensers (3, 4) configured to coherently focus the beam to a single crossover spot F2.

Figure 6:
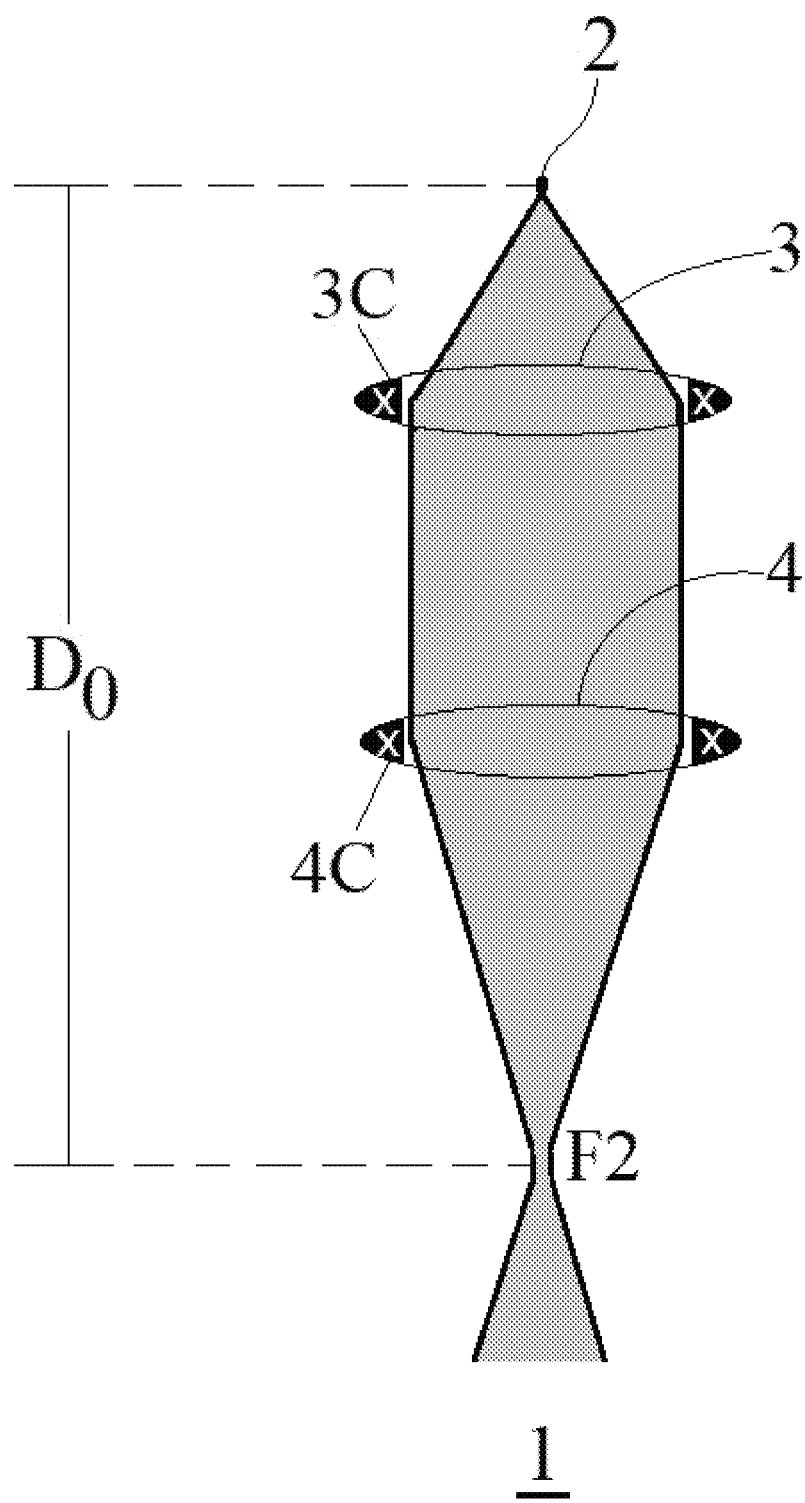
FIG. 6 shows two co-condensers with magnetic coils which can be used in an apparatus of charged-particle beam in accordance with an exemplary embodiment of the present invention.

Referring to FIG. 6, the only two magnetic condensers (3, 4) include a distal magnetic condenser 4 which is distal to the source 2, and a proximal magnetic condenser 3 (top condenser 24) that is located between the source 2 and the distal magnetic condenser 4. The proximal magnetic condenser 3 comprises a magnetic coil 3C driven by a coil current I1; and the distal magnetic condenser 4 comprises a magnetic coil 4C driven by a coil current I2. Generally, both coil currents I1 and I2 are greater than 0 (>0).

In preferred embodiments of the invention, coil currents I1 and I2 are configured to position single crossover spot F2 at a fixed position, i.e. maintain a predetermined distance D0 from source 2. With the "Fixed F2" condition being met, the size A of the crossover spot F2 may be increased by increasing coil current I1 and/or decreasing coil current I2; and decreased by decreasing coil current I1 and/or increasing coil current I2. The size A of the crossover spot F2 will be minimized when coil current I1 reaches its minimal value while coil current I2 reaches its maximal value. The size A is maximized when coil current I2 reaches its minimal value while I1 reaches its maximal value. There is no special limitation on the maximized size A, it may be smaller than, equal to, or bigger than the size of the source 2.

Figure 7:
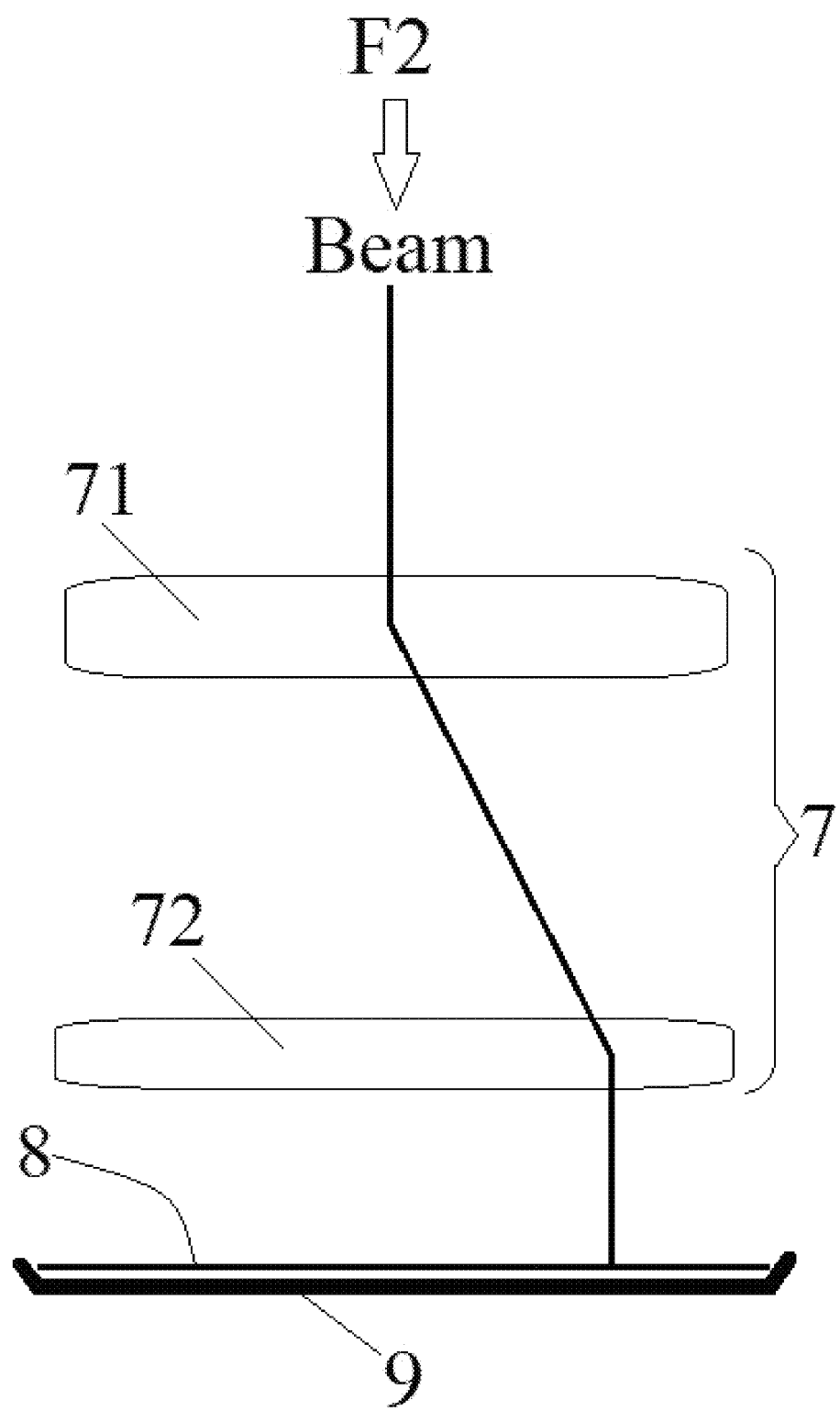
FIG. 7 illustrates an apparatus of charged-particle beam with a magnetic objective lens and a deflection system in accordance with an exemplary embodiment of the present invention.
Figure 12:
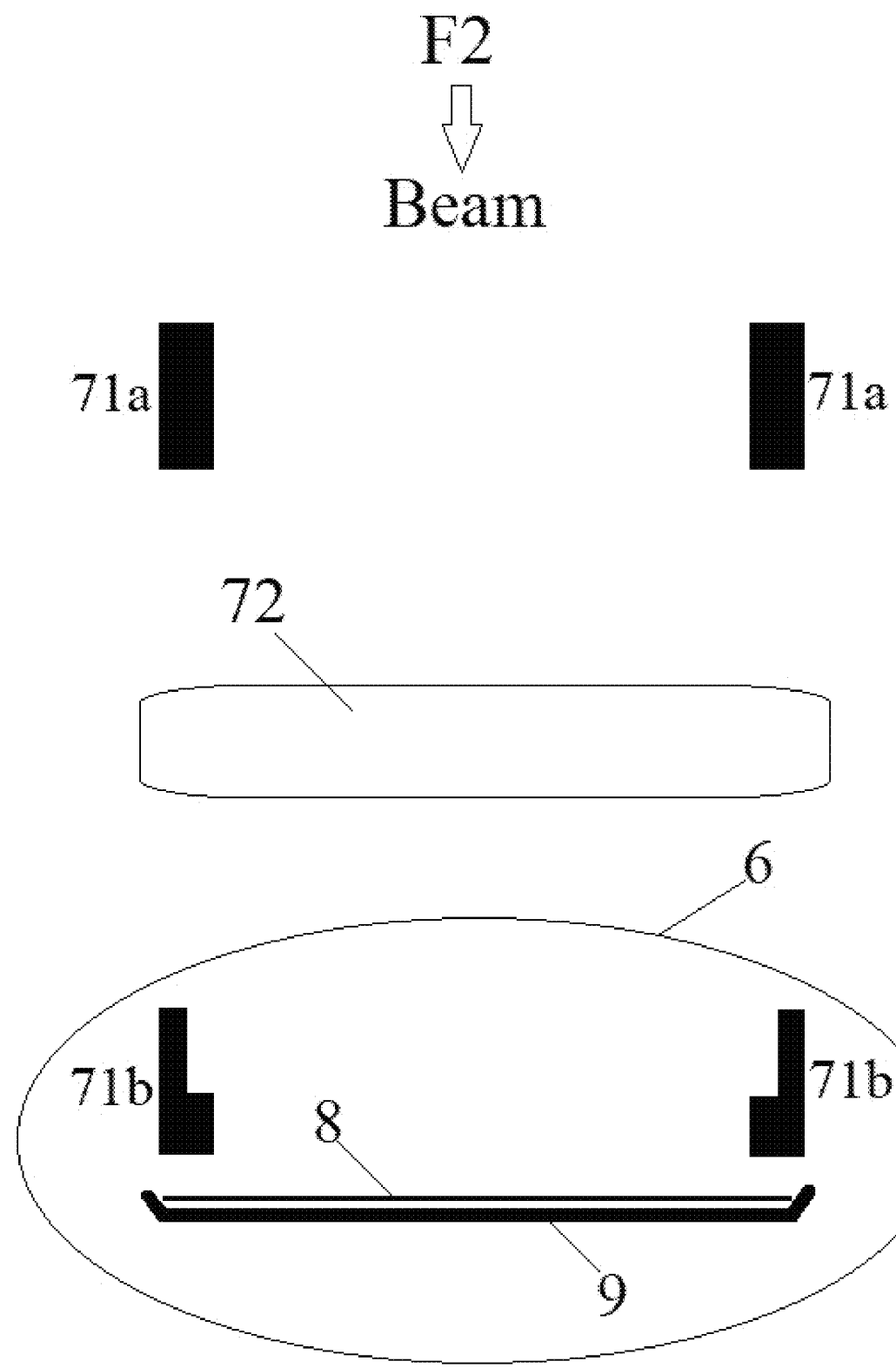
FIG. 12 schematically illustrates the configuration of a macroscopic deflection sub-system in accordance with an exemplary embodiment of the present invention.
Figure 13:
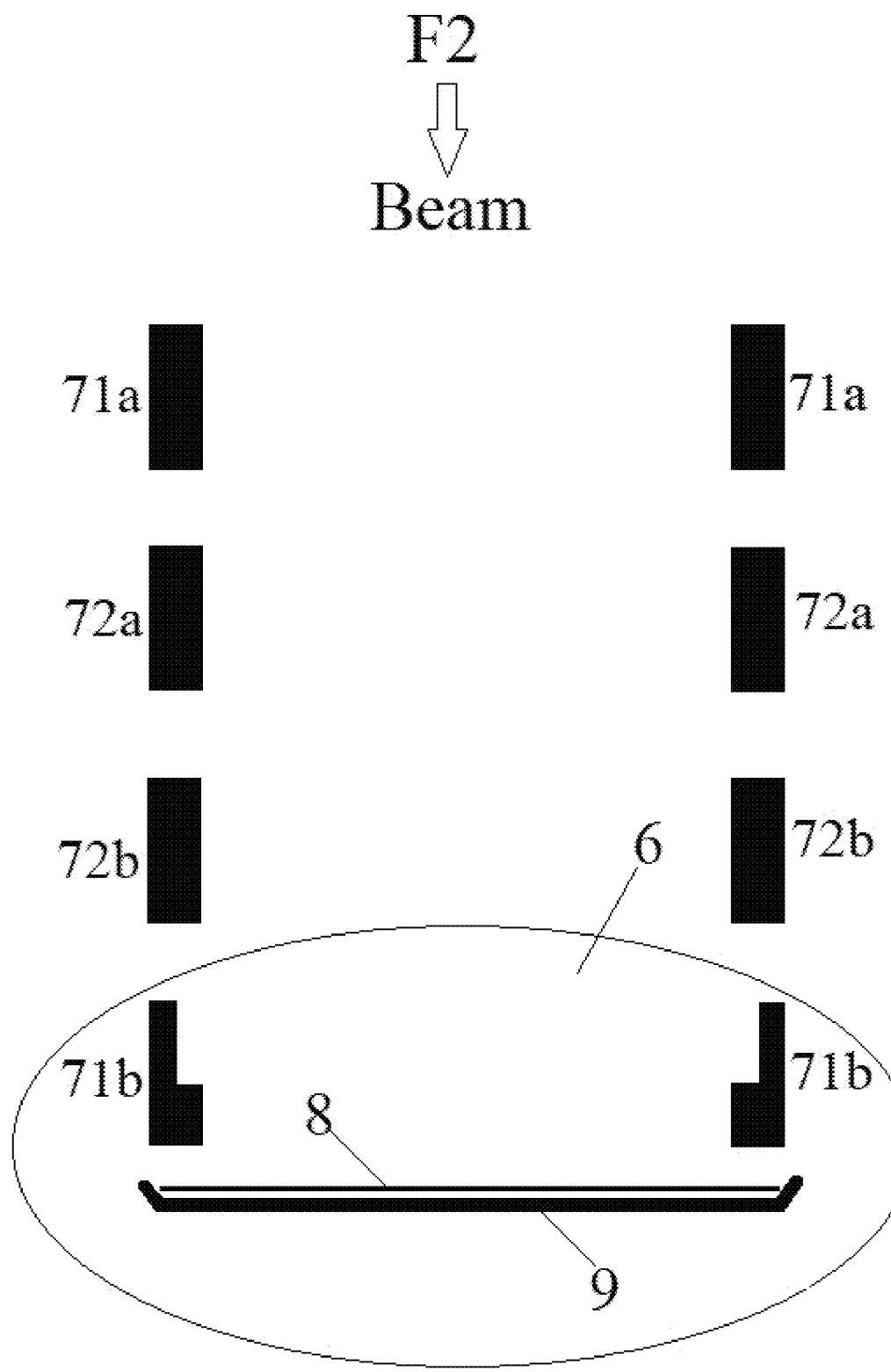
FIG. 13 schematically illustrates the configuration of a microscopic deflection sub-system in accordance with an exemplary embodiment of the present invention.
Figure 14:
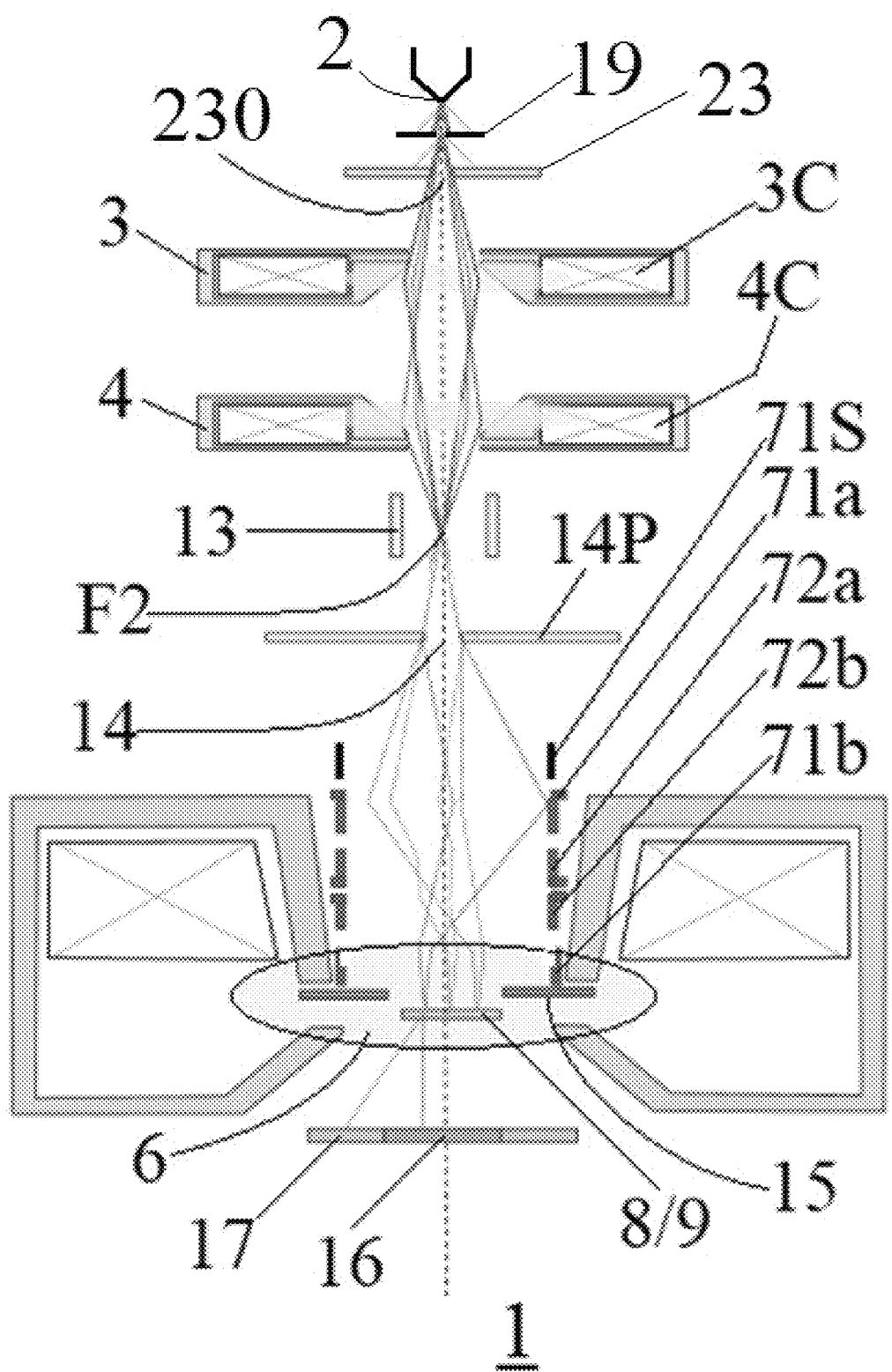
FIG. 14 shows a specific apparatus of electron beam comprising an electron gun with a pinnacle limiting plate having one current-limiting aperture in accordance with an exemplary embodiment of the present invention.

In various exemplary embodiments as shown in FIG. 7, the apparatus of charged-particle beam according to the invention may include a magnetic objective lens 6 (as shown in FIGS. 12-14) and a deflection system 7, both of which are downstream with respect to the single crossover spot F (e.g. F2). Although electron lenses may operate electrostatically or magnetically, most electron lenses use electromagnetic coils to generate a convex lens. The field produced for the lens is typically radially symmetrical, as deviation from the radial symmetry of the magnetic lens causes aberrations such as astigmatism and worsens spherical and chromatic aberration. For example, a quadrupole lens is an arrangement of electromagnetic coils at the vertices of the square, enabling the generation of a lensing magnetic fields, the hexapole configuration simply enhances the lens symmetry by using six, rather than four coils. Electron lenses may be manufactured from iron, iron-cobalt or nickel cobalt alloys, such as permalloy, due to their good magnetic properties, such as magnetic saturation, hysteresis and permeability. It should be appreciated that the objective lens 6 may be an electromagnetic lens or an electrostatic lens.

Objective lens 6 allows for electron beam convergence, with the angle of convergence as a variable parameter. The magnification may be simply changed by modifying the amount of current that flows through the coil of lenses. Lens 6 may include yoke, magnetic coil, poles, pole piece, and external control circuitry. An electromagnetic lens may include an upper pole piece and a lower pole piece. The pole piece must be manufactured in a very symmetrical manner, as this provides the boundary conditions for the magnetic field that forms the lens. Imperfections in the manufacture of the pole piece can induce severe distortions in the magnetic field symmetry, which induce distortions that will ultimately limit the lenses' ability to reproduce the object plane. The exact dimensions of the gap, pole piece internal diameter and taper, as well as the overall design of the lens is often performed by finite element analysis of the magnetic field, taking into account of the thermal and electrical constraints of the design. The coils which produce the magnetic field are located within the lens yoke. The coils can contain a variable current, but typically utilize high voltages, and therefore require significant insulation in order to prevent short-circuiting the lens components. Thermal distributors are placed to ensure the extraction of the heat generated by the energy lost to resistance of the coil windings. The windings may be water-cooled, using a chilled water supply in order to facilitate the removal of the high thermal duty.

A magnetic lens may include a magnetic material and exciting coils for providing magnetomotive force to a magnetic circuit having field lines through the magnetic material and between pole faces.

For the deflection system 7, it may include a macroscopic deflection sub-system 71 and a microscopic deflection sub-system 72. The deflection system 7 causes the beam to position at, and scan across, a large field of view (FOV) on a specimen plane 8 of a specimen under examination (which will occupy the specimen space 22 as shown in FIGS. 1-2) in a specimen holder 9 and one or more small FOVs within the large FOV.

Figure 8:
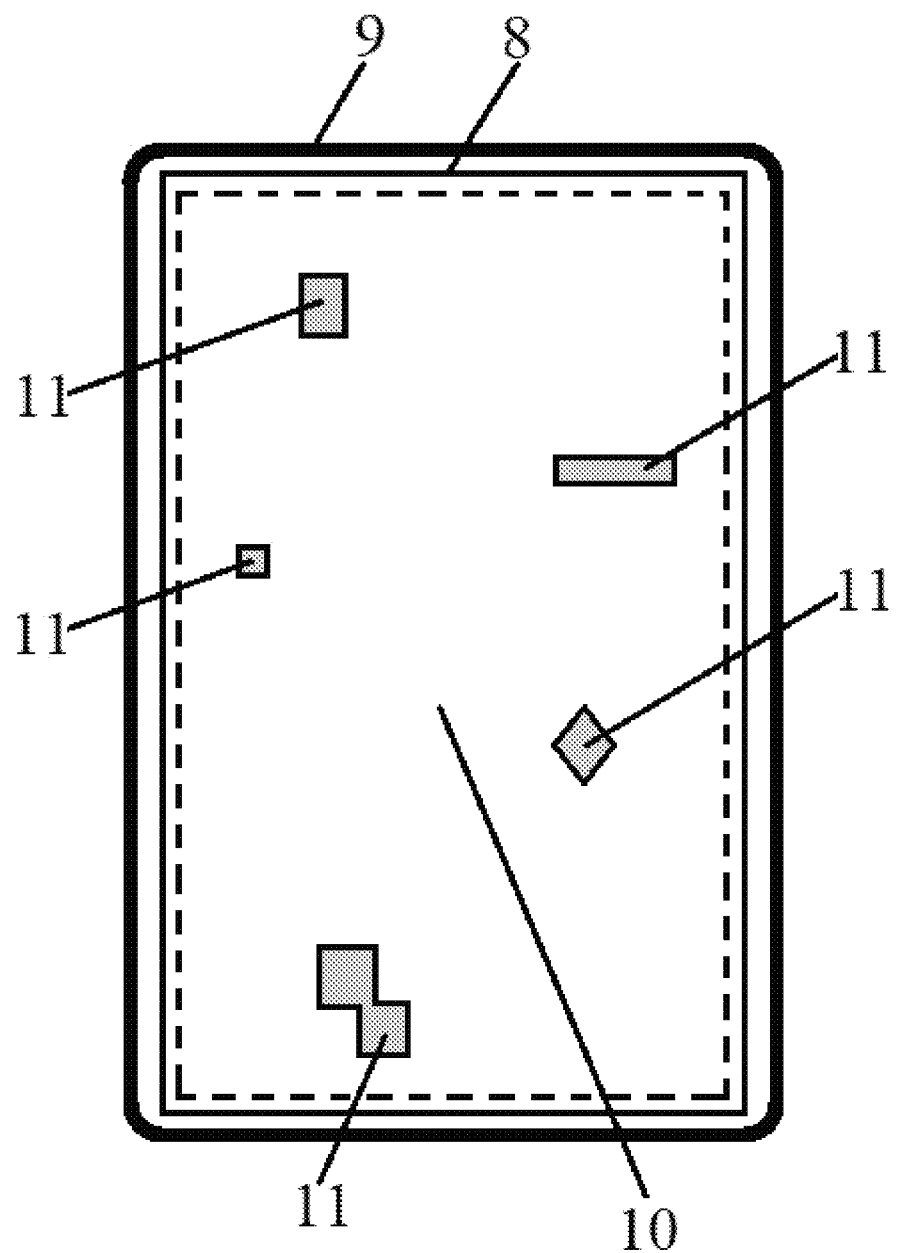
FIG. 8 demonstrates a single large field of view (FOV) on the specimen plane of the apparatus in accordance with an exemplary embodiment of the present invention.
Figure 9:
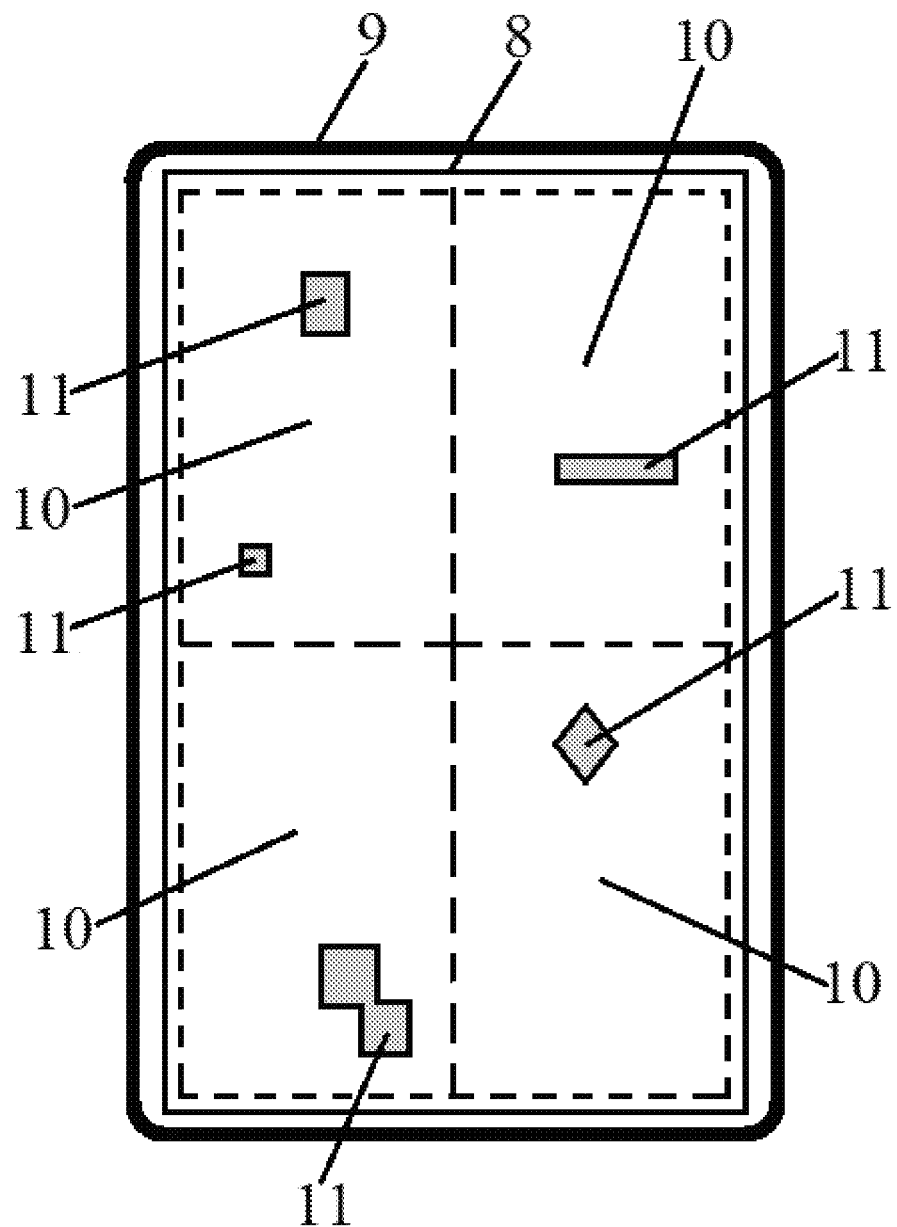
FIG. 9 demonstrates multiple large FOVs on the specimen plane of the apparatus in accordance with an exemplary embodiment of the present invention.

As shown in FIGS. 8 and 9, the macroscopic deflection sub-system 71 causes the beam to scan across a large field of view (FOV) 10 on the specimen plane 8 of the specimen holder 9, and the microscopic sub-deflection system 72 causes the beam to position at, and scan across, one or more small FOVs 11 within a large FOV. As shown in FIG. 8, the specimen plane 8 may contain only one large FOV 10, which may contain zero, one, two, three or more small FOVs 11. In FIG. 9, the specimen plane 8 may contain two, three or more large FOVs 10, each of which may contain zero, one, two, three or more small FOVs 11.

Figure 10:
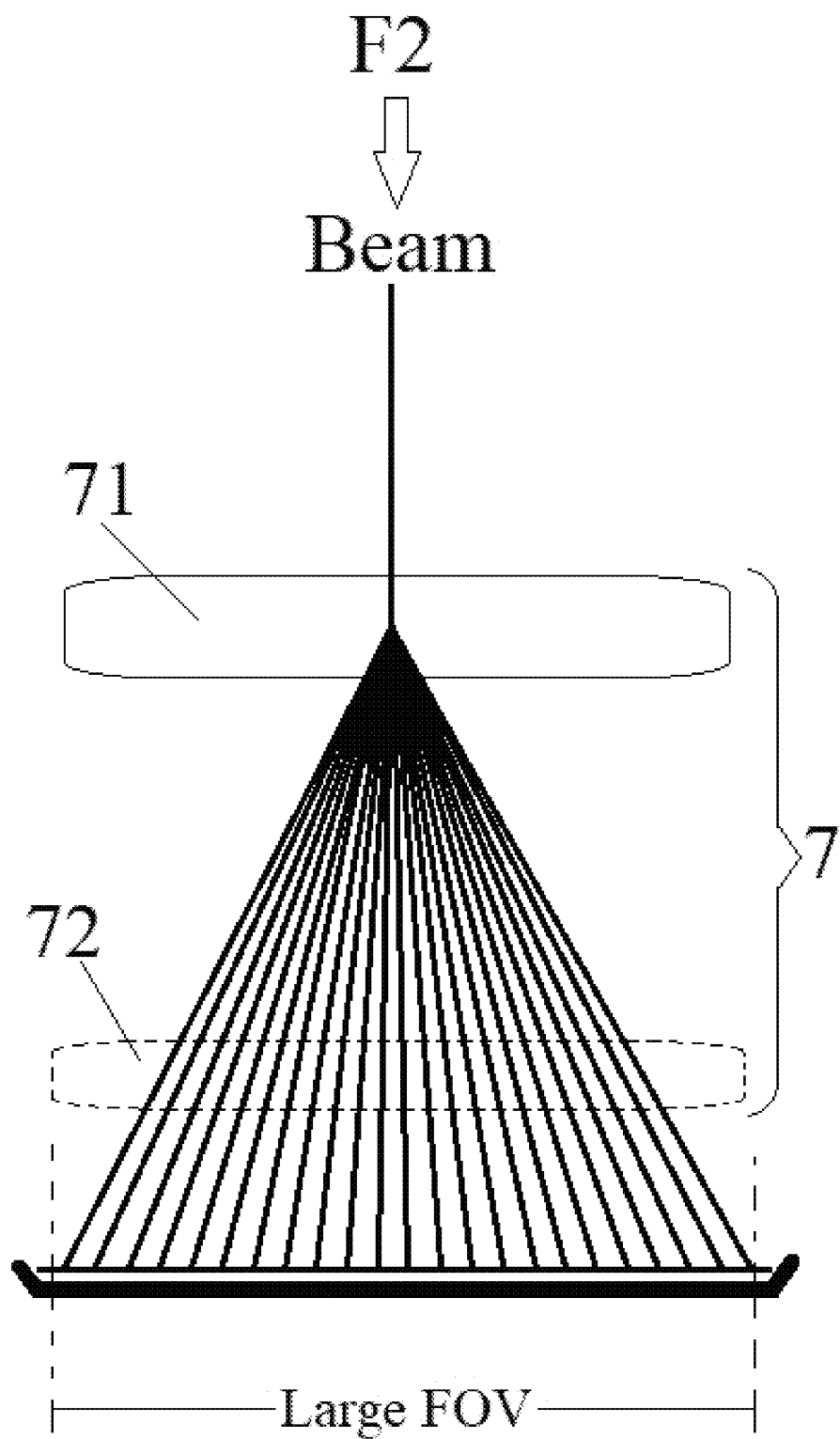
FIG. 10 illustrates a macroscopic deflection sub-system in accordance with an exemplary embodiment of the present invention that alone causes the beam to scan across a large FOV.

In the first step of an examination process as shown in FIG. 10, a user may turn off or inactivate the microscopic sub-deflection system 72. Then, the macroscopic deflection sub-system 71 causes the beam to scan across a large FOV 10 on the specimen plane 8 of the specimen holder 9 under a lower resolution (e.g. 10 nm). After the large FOV scanning is completed, the user finds a pattern of interesting (POI) in one or more small FOVs 11 within that large FOV 10, and the user will then zoom into the POI for further examination with a higher resolution (e.g. 1 nm). As an advantage of the present invention, the user will not need to mechanically move the specimen holder 9 to reposition or align the specimen plane 8 to the center of a target small FOV 11. In other words, the specimen holder 9 remains stationary relative to the source 2 of charged particles, no matter the beam is scanning across a given large FOV 10 or subsequently scanning across one, two or more small FOVs 11 within that large FOV 10.

Figure 11:
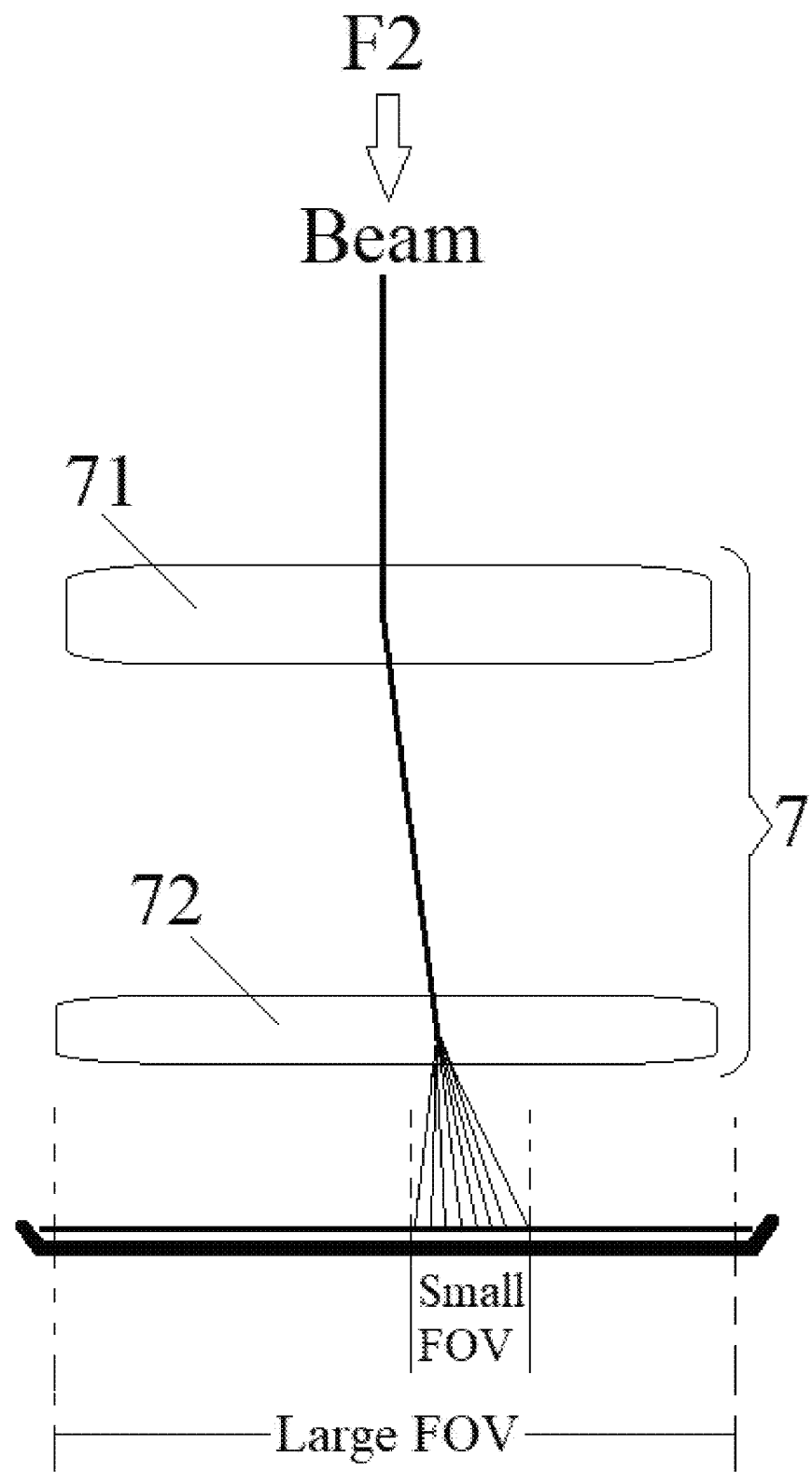
FIG. 11 illustrates a microscopic deflection sub-system causing the beam to scan across a small FOV in accordance with an exemplary embodiment of the present invention.

Instead, the user may run the second step by simply retrieving stored deflecting parameter(s) of the macroscopic deflection sub-system 71 which previously directed the beam to the center of the target small FOV 11. The retrieved deflecting parameter(s) of the macroscopic deflection sub-system 71 will then be re-applied to the subsystem 71, to direct the beam to the center of the target small FOV 11. Generally, the position of any small FOV within a large FOV may be controlled as desired by the macroscopic deflection sub-system 71 by retrieving and re-applying stored deflecting parameters (e.g. voltage). As shown in FIG. 11, after the position of the small FOV within the large FOV is fixed by the macroscopic deflection sub-system 71, the retrieved and re-applied deflecting parameter(s) of the macroscopic deflection sub-system 71 will remain unchanged. Then, the deflecting parameter(s) of the microscopic deflection sub-system 72 is/are varied to cause the beam to scan across the small FOV with a higher resolution.

In various embodiments of the invention, when the beam scans across the large FOV 10 in the first step, the spot F2 has a size A1. When the beam scans across the small FOV 11 within the large FOV 10 in the second step, the spot F2 has a size A2, and A2<A1. The inequation of A2<A1 will result in the resolution for scanning a small FOV is higher than that for a large FOV.

Typically, the size of the large FOV 10 is adjustable, and its image may range from 50 um×50 um to 200 um×200 um in size with a resolution of 0.5-20 nm. For example, the large FOV 10 may have a size of 100 um×100 um with a resolution of 8 nm. The small FOV 11 (e.g. POI, or area of interest) is also adjustable, and it may range from 0.5 um×0.5 um to 5 um×5 um in size with a resolution of 0.5-2 nm. For example, the small FOV may have a size of 5 um×5 um with a resolution of 0.5 nm.

As shown in FIG. 12, the macroscopic deflection sub-system 71 may include an upper deflector 71a, and a lower deflector 71b. The microscopic deflection sub-system 72 may be located between the upper deflector 71a and the lower deflector 71b of the macroscopic deflection system 71. The specimen holder 9 may be downstream with respect to the lower deflector 71b of the macroscopic deflection sub-system 71. As shown in FIG. 13, the microscopic deflection sub-system 72 may also include an upper deflector 72a and a lower deflector 72b.

Any other components known in any apparatus of charged-particle beam or their proper combination may be incorporated in the present invention. For a skilled person in the art, many of the components not shown in FIG. 5 are well-known, for example, suppressor electrode, beam extractor, anode, gun aperture, condenser lens that is responsible for primary beam formation, beam blanker, stigmator for the correction of asymmetrical beam distortions, objective aperture, SEM up detector, deflector, bright field (BF) detector, dark field (DF) detector. A system for the insertion into, motion within, and removal of specimens from the beam path is also needed. The system may include load lock, chamber interlock, lock port, loading and unloading mechanism, and transfer table. Other parts in the microscope may be omitted or merely suggested. In a specific yet exemplary electron microscope 1 as shown in FIG. 14, the source of charged particles may be an electron gun 2 configured to emit an electron beam through current-limiting aperture 230. Along the beam trajectory, top co-condenser 3 with magnetic coil 3C is placed between current-limiting aperture 230 and co-condenser 4 with a magnetic coil 4C. The electron beam is focused to crossover spot F2 before it passes through beam blanking 13. After the beam passes through objective aperture 14, it is deflected by an upper deflector 71a and a lower deflector 71b in the macroscopic deflection sub-system 71. It can also be deflected by an upper deflector 72a and a lower deflector 72b in the microscopic deflection sub-system 72. In the meanwhile, the beam is focused by the magnetic objective lens 6 onto a specimen within the specimen holder 9. Electrons scattered from and penetrated through the specimen are detected by the BSE detector 15, BF detector 16 and DF detector 17 for generating specimen images. Deflectors 71a, 72a, 72b and 71b may reside in the central bore the magnetic objective lens 6, and they are disk-shaped rings which are axially symmetric about the Z-axis. Each deflector may have a same or different diameter and may fit at a particular position along the Z-axis. An actual bucket-shaped structure may be used to holds the deflectors, and the structure is inserted into the bucket-shaped space of the lens system thus making assembly easier.

It should be appreciated that plate 14P with objective aperture 14 in FIG. 14 may be optional (absent or present). If the objective aperture 14 is present, it is sufficiently big that it will not function as a limiting aperture, i.e. it will not reduce the current (ampere) of the electron beam that has passed through (or exists from) the at least one current-limiting aperture 230 after the beam passes through the objective aperture 14.

The multiple deflection system (71a, 71b, 72a and 72b) is designed to control electron deflection with different FOV size. For example, deflectors or deflection nodes 71a and 71b control electron beam to be incident on a large FOV, while deflectors 72a and 72b on a small FOV size.

Figure 15:
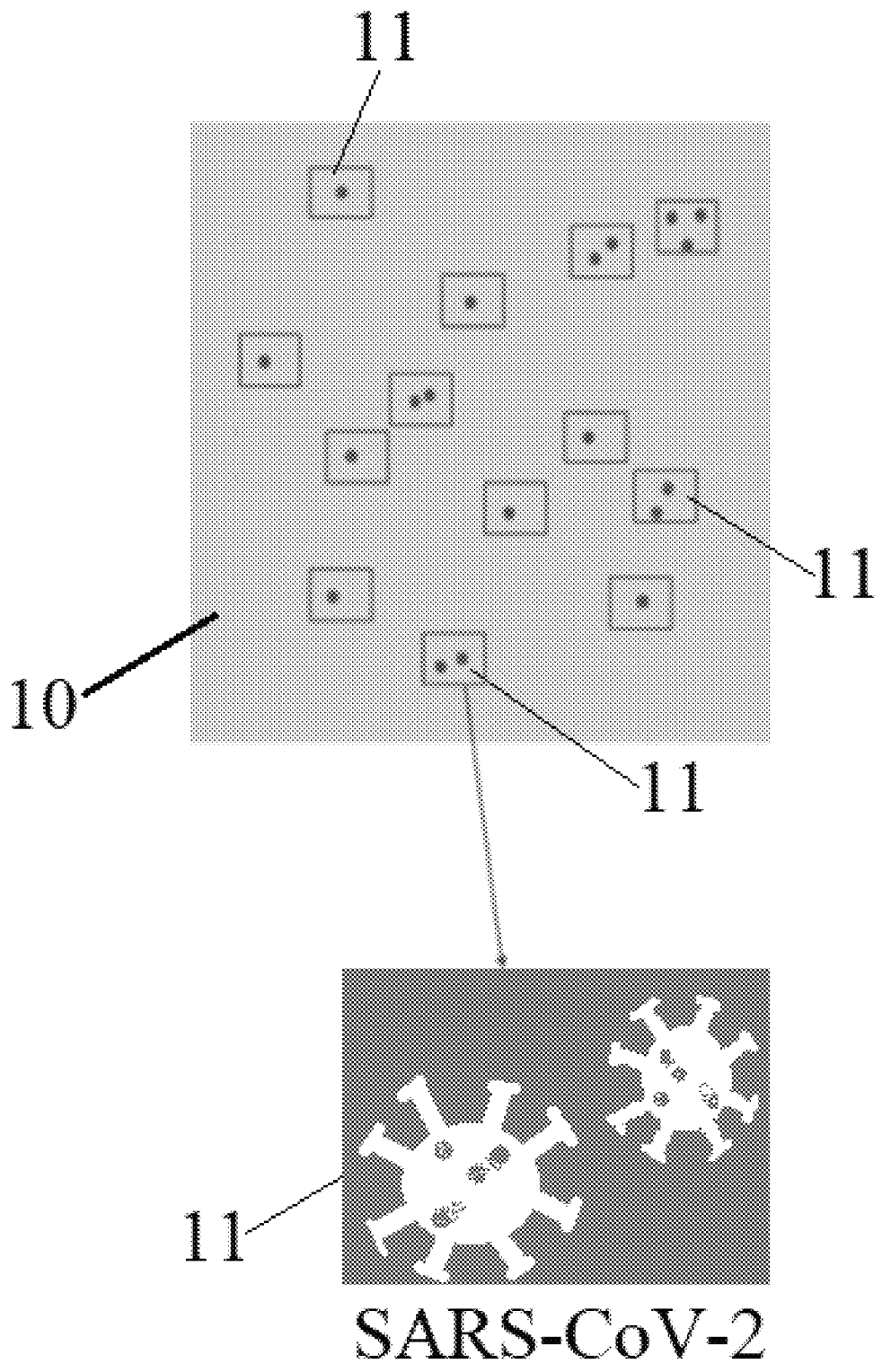

The novel EM column system as shown in FIG. 14 can scan larger FOV with low resolution (like 5, 10 or 20 nm) for the full FOV size. Then, the EM column can switch to high resolution (like 1 nm) automatically without any position and focus change and start immediately to scan high resolution image on any special location. A specific software algorithm can be used to control EM scanning of a larger FOV image with two deflectors (71a, 71b) and co-condensers (3, 4) in a lower resolution mode (i.e. a higher contribution from co-condenser 3 or lower contribution from co-condenser 4). The algorithm will detect related POI (pattern of interesting) and record related location(s). As shown in FIG. 15, the algorithm can detect related POI (pattern of interesting) such as the morphological features of Covid-19 virus (SARS-CoV-2) in a biological sample and record their location(s). Then the software will switch co-condensers (3, 4) to a higher resolution mode (i.e. a lower contribution from co-condenser 3 or a higher contribution from co-condenser 4). The two deflection nodes (71a and 71b) are set to or fixed to a controlled voltage. Other two deflection nodes (72a and 72b) are then used to scan a small FOV 11 with the higher resolution. As shown in the lower panel of FIG. 15, an image of Covid-19 virus (SARS-CoV-2) with a high resolution is acquired. A software system can combine BSE, DF, BF's images from TEM/STEM system and use a machine learning (ML) algorithm to generate an enhanced image with differenced image resolution. Such operations, tasks, and functions are sometimes referred to as being computer-executed, computerized, processor-executed, software-implemented, or computer-implemented. They may be realized by any number of hardware, software, and/or firmware components configured to perform the specified functions. For example, an embodiment of a system or a component may employ various integrated circuit components, e.g., memory elements, digital signal processing elements, logic elements, look-up tables, or the like, which may carry out a variety of functions under the control of one or more microprocessors or other control devices.

When implemented in software or firmware, various elements of the systems described herein are essentially the code segments or executable instructions that, when executed by one or more processor devices, cause the host computing system to perform the various tasks. In certain embodiments, the program or code segments are stored in a tangible processor-readable medium, which may include any medium that can store or transfer information. Examples of suitable forms of non-transitory and processor-readable media include an electronic circuit, a semiconductor memory device, a ROM, a flash memory, an erasable ROM (EROM), a floppy diskette, a CD-ROM, an optical disk, a hard disk, or the like.

Through the above description of the embodiments, those skilled in the art can understand clearly that the present application may be implemented by means of software plus necessary hardware platforms, or of course, may also be implemented all by software or hardware. Based on such understanding, the entirety of or a portion of that the technical solutions of the present application contribute over the background art may be embodied in the form of a software product. The computer software product may be stored in storage medium, such as ROM/RAM, disk, optical disk, etc., and comprise several instructions for enabling one computer apparatus (which may be a personal computer, a server, or a network equipment, etc.) to execute the methods described in the respective embodiments or described in certain parts of the embodiments of the present application.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. An apparatus of electron beam comprising:
    an electron gun 18,
    an electron optical column 20 below the electron gun 18, and
    a sample chamber 21 below the column 20;
    wherein the electron gun 18 comprises a bottom (or lowest) anode 19, a top (or highest) condenser 24, and a pinnacle limiting plate 23 therebetween;
    wherein the pinnacle limiting plate 23 has at least one current-limiting aperture (230),
    wherein the sample chamber 21 has a sample space 22 for placing a specimen under examination or a lithographical workpiece, and
    wherein the apparatus is so configured that a current (ampere) of the electron beam that has passed through the at least one current-limiting aperture 230 remains the same after the electron beam travels through the top condenser 24 and the electron optical column 20 and arrives at the sample space 22.

2. The apparatus of electron beam according to claim 1, wherein the pinnacle limiting plate 23 has two or more current-limiting apertures (230) with different sizes for allowing electron beams with different currents (ampere) or different cross-sectional areas to pass through, and
    wherein the pinnacle limiting plate 23 is movable relative to the bottom anode 19 so as to select which one of said two or more current-limiting apertures (230) is used for the electron beam to pass through (i.e. limiting the beam).

3. The apparatus of electron beam according to claim 2, further comprising a motor 25 for moving the pinnacle limiting plate 23 relatively to the bottom anode 19.

4. The apparatus of electron beam according to claim 3, wherein the motor 25 can move (position and reposition) the pinnacle limiting plate 23 with an accuracy of 100 nm.

5. The apparatus of electron beam according to claim 4, wherein the motor 25 is a voice coil motor or a piezoelectric motor.

6. The apparatus of electron beam according to claim 1, wherein the bottom anode 19 is an acceleration anode.

7. The apparatus of electron beam according to claim 6, wherein the electron gun 18 comprises a field emission-type electron gun, which includes a cathode as an electron source, an extractor with a hole below the cathode, and wherein the acceleration anode 19 with a hole is located below the extractor.

8. The apparatus of electron beam according to claim 1, wherein the current (ampere) of the electron beam that has passed through the current-limiting aperture 230 is in a range of from 1 picoamp to 500 nanoamps.

9. The apparatus of electron beam according to claim 1, wherein the sample chamber includes a specimen holder 9 for holding said specimen under examination, a receptacle for receiving said lithographical workpiece being processed with the beam.

10. The apparatus of electron beam according to claim 1, wherein the top condenser 24 includes a first co-condenser 3 and a second co-condenser 4.

11. The apparatus of electron beam according to claim 1, wherein the electron optical column 20 includes one or more electron optical components selected from stigmator(s), alignment coil(s), alignment plate(s), deflector(s), beam blanking(s), plate(s) with spread aperture(s), magnetic objective lens(es), and detector(s).

12. The apparatus of electron beam according to claim 1, wherein the electron optical column 20 and the sample chamber 21 do not include any plate with limiting aperture(s).

13. The apparatus of electron beam according to claim 1, wherein the electron optical column 20 includes one or more electron optical components selected from (from beam upstream to downstream): a stigmator (71s), an upper macroscopic deflector 71a, an upper microscopic deflector 72a, a lower microscopic deflector 72b, a lower macroscopic deflector 71b, a magnetic objective lens 6, and a BSE or SE detector 15, but it does not include any plate with limiting aperture(s).

14. The apparatus of electron beam according to claim 1, wherein the sample chamber further includes one or more detectors for detecting electrons.

15. The apparatus of electron beam according to claim 1, wherein the pinnacle limiting plate 23 is made of a non-magnetic conductive material.

16. The apparatus of electron beam according to claim 1, wherein the apparatus is configured as an electron microscope and an electron beam lithographical apparatus.

17. A method of reducing electron-electron interaction of an electron beam in an apparatus of electron beam, comprising:
    providing an apparatus of electron beam comprising an electron gun 18, an electron optical column 20 below the electron gun 18, and a sample chamber 21 below the column 20, wherein the electron gun 18 comprises a bottom (or lowest) anode 19 and a top (or highest) condenser 24, and wherein the sample chamber 21 has a sample space 22 for placing a specimen under examination or a lithographical workpiece;
    placing a pinnacle limiting plate 23 between the bottom anode 19 and the top condenser 24, wherein the pinnacle limiting plate 23 has at least one current-limiting aperture (230); and
    passing an electron beam through the at least one current-limiting aperture 230, wherein a current (ampere) of the electron beam that has passed through the at least one current-limiting aperture 230 remains the same after the electron beam travels through the top condenser 24 and the electron optical column 20 and arrives at the sample space 22.

18. The method according to claim 17, wherein the pinnacle limiting plate 23 has two or more current-limiting apertures (230) with different sizes for allowing electron beams with different currents (ampere) or different cross-sectional areas to pass through, further comprising:

moving the pinnacle limiting plate 23 relatively to the bottom anode 19 so as to select which one of said two or more current-limiting apertures (230) is used for the electron beam to pass through (i.e. limiting the beam).

19. The method according to claim 18, wherein said moving the pinnacle limiting plate 23 is accomplished with a motor 25 such as a voice coil motor or a piezoelectric motor.

20. The method according to claim 19, wherein the motor 25 can move (position and reposition) the pinnacle limiting plate with an accuracy of 100 nm.

* * * * *